US011859112B2

(12) United States Patent
Fujiwara et al.

(10) Patent No.: US 11,859,112 B2
(45) Date of Patent: Jan. 2, 2024

(54) PASTE COMPOSITION, SEMICONDUCTOR DEVICE, AND ELECTRICAL/ELECTRONIC COMPONENT

(71) Applicant: KYOCERA Corporation, Kyoto (JP)

(72) Inventors: Masakazu Fujiwara, Yokohama (JP); Yuya Nitanai, Yokohama (JP)

(73) Assignee: KYOCERA CORPORATION, Kyoto (JP)

( * ) Notice: Subject to any disclaimer, the term of this patent is extended or adjusted under 35 U.S.C. 154(b) by 328 days.

(21) Appl. No.: 15/930,842

(22) Filed: May 13, 2020

(65) Prior Publication Data

US 2020/0279792 A1    Sep. 3, 2020

Related U.S. Application Data

(63) Continuation of application No. PCT/JP2018/039347, filed on Oct. 23, 2018.

(30) Foreign Application Priority Data

Nov. 13, 2017  (JP) ................................ 2017-218316

(51) Int. Cl.
| | | |
|---|---|---|
| C09J 9/02 | (2006.01) | |
| B22F 1/06 | (2022.01) | |
| B22F 1/102 | (2022.01) | |
| B22F 1/054 | (2022.01) | |
| B22F 1/107 | (2022.01) | |
| H01L 23/373 | (2006.01) | |
| H01L 33/64 | (2010.01) | |

(52) U.S. Cl.
CPC ............... *C09J 9/02* (2013.01); *B22F 1/054* (2022.01); *B22F 1/056* (2022.01); *B22F 1/06* (2022.01); *B22F 1/102* (2022.01); *B22F 1/107* (2022.01); *H01L 23/3737* (2013.01); *H01L 33/641* (2013.01); *B22F 2301/10* (2013.01)

(58) Field of Classification Search
None
See application file for complete search history.

(56) References Cited

U.S. PATENT DOCUMENTS

| | | | | |
|---|---|---|---|---|
| 4,789,411 A | * | 12/1988 | Eguchi .................... | H01B 1/22 148/24 |
| 9,168,587 B2 | | 10/2015 | Kurihara | |
| 2012/0025257 A1 | * | 2/2012 | Wu ......................... | H01L 33/62 257/E33.056 |
| 2013/0248775 A1 | | 9/2013 | Kurihara | |
| 2014/0296437 A1 | * | 10/2014 | Hatae ..................... | C08F 265/06 525/289 |
| 2017/0043404 A1 | | 2/2017 | Fukumoto et al. | |
| 2017/0073538 A1 | | 3/2017 | Kawasaki et al. | |
| 2017/0152386 A1 | * | 6/2017 | Okada ..................... | C09C 1/62 |
| 2017/0236768 A1 | | 8/2017 | Naito et al. | |
| 2018/0029121 A1 | * | 2/2018 | Urashima .............. | H01B 1/026 |
| 2018/0036805 A1 | | 2/2018 | Fukumoto et al. | |

FOREIGN PATENT DOCUMENTS

| | | |
|---|---|---|
| CN | 103262173 A | 8/2013 |
| CN | 106029261 A | 10/2016 |
| CN | 106457407 A | 2/2017 |
| CN | 106536437 A | 3/2017 |
| CN | 107249788 A | 10/2017 |
| EP | 3093882 A1 | 11/2016 |
| JP | 2002-329945 A | 11/2002 |
| JP | 2005-113059 A | 4/2005 |
| JP | 2006-086273 A | 3/2006 |
| JP | 2011-240406 A | 12/2011 |
| JP | 2012-131894 A | 7/2012 |
| JP | 2014058713 A * | 4/2014 |
| JP | 2015-227476 A | 12/2015 |
| JP | 5858374 B2 | 2/2016 |
| JP | 2016-069716 A | 5/2016 |
| JP | 2017-206755 A | 11/2017 |
| KR | 10-2016-0126989 A | 11/2016 |
| TW | 201601993 A | 1/2016 |
| WO | 2015/104954 A1 | 7/2015 |
| WO | 2015/129466 A1 | 9/2015 |
| WO | 2015/182395 A1 | 12/2015 |
| WO | 2016/043095 A1 | 3/2016 |
| WO | WO-2016136753 A1 * | 9/2016 ............... B22F 1/00 |

OTHER PUBLICATIONS

Chinese Office Action dated Aug. 24, 2021 for Chinese Patent Application No. 201880073439.3.
Chinese Office Action dated Feb. 2, 2021 for the Chinese Patent Application No. 201880073439.3.
Korean Office Action dated Jul. 7, 2021 for Korean Patent Application No. 10-2020-7013991.
Extended European Search Report dated Jul. 22, 2021 for European Patent Application No. 18875326.3.

* cited by examiner

*Primary Examiner* — Tanisha Diggs
(74) *Attorney, Agent, or Firm* — Volpe Koenig

(57) ABSTRACT

There is provided a paste composition using copper fine particles that are capable of exhibiting conductivity after low-temperature sintering, which themselves are less oxidized, and that can be produced with a high yield ratio. A paste composition contains: (A) copper fine particles having a thickness or minor axis of 10 to 500 nm and coated with amino alcohol represented by the chemical formula (1) and (B) an organic solvent.

14 Claims, 2 Drawing Sheets

PASTE COMPOSITION, SEMICONDUCTOR DEVICE, AND ELECTRICAL/ELECTRONIC COMPONENT

CROSS REFERENCE TO RELATED APPLICATION

The present application is a continuation of International Application No. PCT/JP2018/039347, filed Oct. 23, 2018, which claims priority to Japanese Patent Application No. 2017-218316, filed Nov. 13, 2017. The contents of these applications are incorporated herein by reference in their entirely.

FIELD

The present disclosure relates to a paste composition, and a semiconductor device and an electrical/electronic component made with the paste composition.

BACKGROUND

The influence of heat generated during the operation of semiconductor products is becoming more pronounced as the semiconductor products come to have a larger capacity, a higher processing speed, and finer wiring. Accordingly, what is called thermal management of releasing heat from semiconductor products has been attracting attention. Here, a method of attaching a heat dissipating member such as a heat spreader or a heat sink to a semiconductor product is typically adopted, and higher thermal conductivity is required of a material itself for bonding the heat dissipating member.

Further, in some form of a semiconductor product, a method of bonding a heat spreader to a semiconductor element itself or to a die pad portion of a lead frame to which the semiconductor element is bonded is adopted. Also adopted is a method of exposing a die pad portion to a package surface so that the die pad portion has a function as a heat dissipation plate.

There is also a case in which a semiconductor element of a semiconductor product is bonded to an organic substrate or the like that has a heat dissipating mechanism such as a thermal via. In this case, high thermal conductivity is also required of a material for bonding the semiconductor element.

Further, because of the recent increase in the brightness of white LEDs, they are now widely used in lighting devices such as backlighting for full-color liquid crystal screens, ceiling lights, and downlights. However, the increase in the brightness of white LEDs increases the amount of heat generated by a light-emitting element chip. Accordingly, improved heat dissipation performance is also required of the structure of LEDs and members used therein.

In particular, in recent years, power semiconductor devices made with wide-band-gap semiconductors such as silicon carbide (SiC) and gallium nitride which have low power loss have been actively developed, and owing to the improved heat resistance of their elements themselves, the operation at high temperatures of 250° C. or higher with large currents becomes possible. However, to make this property exhibited, the efficient dissipation of heat generated during the operation is needed, giving rise to a demand for a joining material excellent not only in conductivity and heat transfer properties but also in long-term high-temperature heat resistance.

As described above, high thermal conductivity is required of materials (die attach paste, heat dissipating member joining material, or the like) used for joining members of semiconductor devices and electrical/electronic components. At the same time, these materials need to withstand a reflow process performed when the product is mounted on a substrate, and in many cases, are required to bond a large area and thus need to also have low stress to reduce the occurrence of warp or the like due to a difference in thermal expansion coefficient between constituent members.

To obtain an adhesive with high thermal conductivity here, a metal filler such as silver powder or copper powder, a ceramic-based filler such as aluminum nitride or boron nitride, or the like usually needs to be dispersed with a high content ratio as a filler in an organic binder.

These days, on the other hand, as a candidate for a joining method that can meet such a requirement, a joining method using silver nanoparticles which allow the joining under a condition of lower temperatures than bulk silver has been attracting attention.

Currently, copper particles which are cheaper and more migration-resistant than silver particles have been attracting attention.

Further, under such circumstances, nano-sized metal fine particles are expected as a conductive material, and their studies are underway. Specifically, a means for providing smaller nano-sized copper fine particles has been studied. An example of a known method to produce the copper fine particles is a method that produces copper fine powder by pyrolyzing a copper oxalate-hydrazine complex.

SUMMARY

A paste composition of the present disclosure contains: (A) copper fine particles having a thickness or minor axis of 10 to 500 nm and coated with amino alcohol represented by the following chemical formula (1); and (B) an organic solvent, wherein a compounding amount of (B) the organic solvent is 2 to 20 parts by mass relative to 100 parts by mass of (A) the copper fine particles,

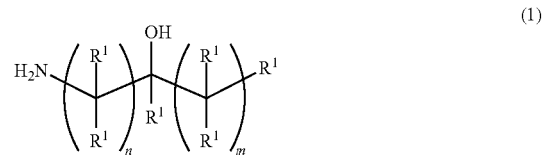

where $R^1$s may be identical or different, each independently represent a hydrogen atom, an alkyl group with a carbon number of 1 to 4, a hydroxy group, or a methoxy group, n and m each represent an integer of 0 to 10, and m+n is 10 or less.

DETAILED DESCRIPTION

Figure 1:
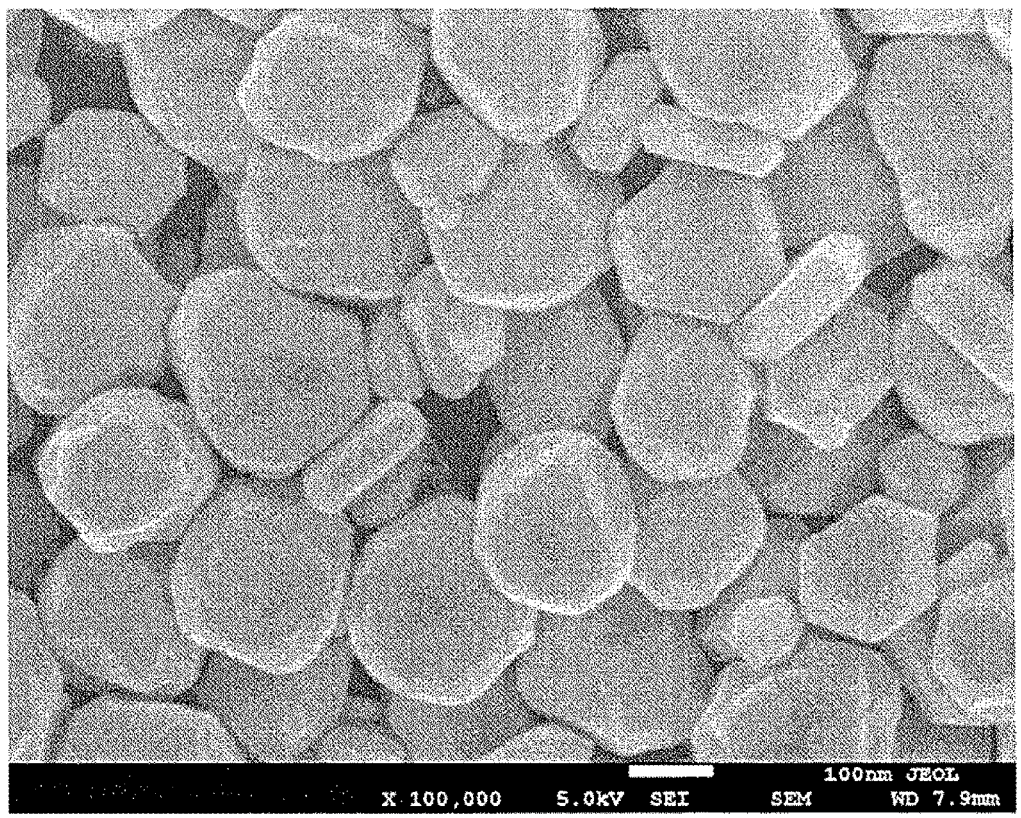
FIG. 1 is an electron micrograph of copper fine particles obtained in Reference Example 1.

The present disclosure will be hereinafter described.

<Paste Composition>

A paste composition of this embodiment contains: (A) copper fine particles having a thickness or minor axis of 10 to 500 nm and coated with amino alcohol having a predetermined structure; and (B) an organic solvent.

[(A) Copper Fine Particles]

In this embodiment, (A) the copper fine particles have a thickness or minor axis of 10 to 500 nm and are coated with amino alcohol represented by the chemical formula (1). Such copper fine particles can be produced as follows, for example. Note that, in this specification, coat means that the aforesaid amino alcohol adheres to the whole or part of the surfaces of the copper fine particles.

(Method of Producing (A) the Copper Fine Particles)

It is possible to obtain the copper fine particles used in this embodiment by mixing a copper-containing compound, the amino alcohol, and a reducing compound in the organic solvent and heating the resultant mixture to a temperature at which the copper-containing compound is pyrolyzed, to produce the copper fine particles.

The copper fine particles obtained by this production method have surfaces coated with the amino alcohol, and their oxidation is lessened owing to the amino alcohol coating the surfaces, so that copper fine particles with desired properties and qualities are obtained.

The following describes the raw materials used in the production of the copper fine particles of this embodiment.

<Copper-Containing Compound>

The copper-containing compound used here is a material for precipitating metallic copper to produce the copper fine particles. The copper-containing compound is decomposed by the heating to release copper ions. The copper-containing compound may be one that releases these copper ions which are then reduced to the metallic copper. This copper-containing compound may also be one that is decomposed by the heating to release the copper ions and organic matter ions derived from the copper-containing compound.

Examples of such a copper-containing compound include copper carboxylate in which carboxylic acid such as formic acid, oxalic acid, malonic acid, benzoic acid, or phthalic acid is combined with copper. Other examples of the copper-containing compound include cuprous oxide, copper nitrate, and copper sulfate.

<Amino Alcohol>

The amino alcohol used here is alcohol having an amino group represented by the following chemical formula (1).

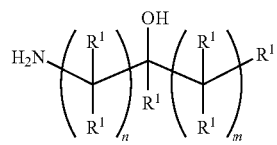

(1)

(In the formula, $R^1$s may be identical or different, and each independently represent a hydrogen atom, an alkyl group with a carbon number of 1 to 4, a hydroxy group, or a methoxy group, n and m each represent an integer of 0 to 10, and m+n is 10 or less.)

Specific examples include aminoethanol, heptaminol, propanolamine, 1-amino-2-propanol, 2-aminodibutanol, 2-diethylaminoethanol, 3-diethylamino-1,2-propanediol, 3-dimethylamino-1,2-propanediol, 3-methylamino-1,2-propanediol, and 3-amino-1,2-propanediol. These may have a boiling point of 70 to 300° C. from the viewpoint of sinterability. Further, from the viewpoint of workability, the amino alcohol may also be liquid at room temperature.

<Reducing Compound>

The reducing compound used here is not particularly limited as long as it has reducing power to reduce the copper ions generated as a result of the decomposition of the copper-containing compound and liberate the metallic copper. Further, the boiling point of the reducing compound may be 70° C. or higher. The boiling point of the reducing compound may be higher than or equal to a heating temperature in the heating process. In addition, the reducing compound may be a compound dissolved in (B) the later-described organic solvent formed from carbon, hydrogen, and oxygen.

Such a reducing compound is typically a hydrazine derivative. Examples of the hydrazine derivative include hydrazine monohydrate, methylhydrazine, ethylhydrazine, n-propylhydrazine, i-propylhydrazine, n-butylhydrazine, i-butylhydrazine, sec-butylhydrazine, t-butylhydrazine, n-pentylhydrazine, i-pentylhydrazine, neo-pentylhydrazine, t-pentylhydrazine, n-hexylhydrazine, i-hexylhydrazine, n-heptylhydrazine, n-octylhydrazine, n-nonylhydrazine, n-decylhydrazine, n-undecylhydrazine, n-dodecylhydrazine, cyclohexylhydrazine, phenylhydrazine, 4-methylphenylhydrazine, benzylhydrazine, 2-phenylethylhydrazine, 2-hydrazinoethanol, and acetohydrazine.

<Organic Solvent>

In the production of the copper fine particles used in this embodiment, the above-described copper-containing compound, amino alcohol, and reducing compound may be mixed in the organic solvent.

As the organic solvent used here, one that can be used as a reaction solvent not impairing the natures of a complex and so on generated from the mixture obtained as a result of the above mixing is usable without any particular limitation. The organic solvent may also be alcohol that has compatibility with the above-described reducing compound.

Further, since the reduction reaction of the copper ions which is caused by the reducing compound is an exothermic reaction, an organic solvent that does not volatilize during the reduction reaction is also acceptable.

If the organic solvent volatilizes, it is difficult to control the generation of the copper ions resulting from the decomposition of the copper-containing compound-amine compound complex and the precipitation of the metallic copper due to the reduction of the generated copper ions, and as a result, shape stability may deteriorate. Therefore, the organic solvent may have a boiling point of 70° C. or higher and may be formed from carbon, hydrogen, and oxygen. If the boiling point of the organic solvent is 70° C. or higher, it is easy to control the generation of the copper ions resulting from the decomposition of the copper-containing compound-alcohol amine compound complex and the precipitation of the metallic copper due to the reduction of the generated copper ions, leading to the stability of the shape of the copper fine particles.

Examples of the aforesaid alcohol used as the organic solvent include 1-propanol, 2-propanol, butanol, pentanol, hexanol, heptanol, octanol, ethylene glycol, 1,3-propanediol, 1,2-propanediol, butyl carbitol, butyl carbitol acetate, ethyl carbitol, ethyl carbitol acetate, diethylene glycol diethyl ether, and butyl cellosolve.

Note that this organic solvent does not include the aforesaid amino alcohol or reducing compound.

<Another Amine Compound>

Another amine compound may be further added when the copper fine particles used in this embodiment are produced.

Examples of the other amine compound include a compound containing at least one selected from the following alkylamines and alkoxyamines. This amine compound is not particularly limited as long as it forms a complex with the copper-containing compound.

Those appropriately selected from these amine compounds can be used according to the condition of the pyrolysis of the copper-containing compound to be used, the properties expected of the copper fine particles to be produced, and so on.

These amine compounds have a function of lessening the oxidation of the copper fine particles by adhering to the surfaces of the copper fine particles obtained as a result of the pyrolysis of the copper-containing compound.

By controlling a growth direction of the metallic copper in this way, it is possible to obtain copper fine particles with a specific shape such as a polyhedral shape or a plate shape.

The structure of the alkylamine is not particularly limited as long as it is an amine compound in which an aliphatic hydrocarbon group such as an alkyl group is bonded to an amino group. It is, for example, alkyl monoamine having one amino group or alkyldiamine having two amino groups. Note that the above alkyl group may further have a substituent.

Specific examples of the alkyl monoamine include dipropylamine, butylamine, dibutylamine, hexylamine, cyclohexylamine, heptylamine, octylamine, nonylamine, decylamine, 3-aminopropyltriethoxysilane, dodecylamine, and oleylamine. Examples of the alkyldiamine include ethylenediamine, N,N-dimethylethylenediamine, N,N'-dimethylethylenediamine, N,N-diethylethylenediamine, N,N'-diethylethylenediamine, 1,3-propanediamine, 2,2-dimethyl-1,3-propanediamine, N,N-dimethyl-1,3-diaminopropane, N,N'-dimethyl-1,3-diaminopropane, N,N-diethyl-1,3-diaminopropane, 1,4-diaminobutane, 1,5-diamino-2-methylpentane, 1,6-diaminohexane, N,N'-dimethyl-1,6-diaminohexane, 1,7-diaminoheptane, and 1,8-diaminooctane.

Note that the alkylamine does not include the alkoxyamine described below.

The structure of the alkoxyamine is not particularly limited as long as it is an amine compound having an alkoxyl group, and it is, for example, alkoxy monoamine having one amino group or alkoxydiamine having two amino groups. Specifically, examples of the alkoxy monoamine include methoxyethylamine, 2-ethoxyethylamine, and 3-butoxypropylamine, and examples of the alkoxydiamine include N-methoxy-1,3-propanediamine and N-methoxy-1,4-butanediamine. In consideration of coordination force to the copper generated as a result of the reduction, the alkoxyamine may be alkoxy monoamine such as primary amine ($R^2ONH_2$) or secondary amine ($R^3(R^4O)NH$).

Here, the substituent $R^2$ of the primary amine mentioned in the aforesaid alkylamine and alkoxyamine represents an alkyl group and may be an alkyl group with a carbon number of 4 to 18. Further, the substituents $R^3$ and $R^4$ of the secondary amine each represent an alkyl group, and both may be alkyl groups with a carbon number of 4 to 18. The substituents $R^3$ and $R^4$ may be identical or different. Further, these alkyl groups may have a substituent such as a silyl group or a glycidyl group.

The boiling point of this amine compound may be not lower than 70° C. nor higher than 200° C., or may be not lower than 120° C. nor higher than 200° C. If the boiling point of the amine compound is 70° C. or higher, the amine volatilizes less in the heating process. If the boiling point of the amine compound is 200° C. or lower, the amine compound volatilizes during the sintering of the copper fine particles to be removed to the outside of the system, resulting in good low-temperature sinterability.

The copper fine particles can be produced as follows using the above-described copper-containing compound, amino alcohol, and reducing compound, and further the organic solvent and the amine compound which are added as required.

<Forming of the Mixture>

In the method of producing the copper fine particles of the present disclosure, the organic solvent is first put in a reaction vessel, and the above-described copper-containing compound, amino alcohol, and reducing compound, and as required, the organic solvent and the amine compound are mixed in the organic solvent. As for the mixing order, the aforesaid compounds may be mixed in any order.

In this mixing, the copper-containing compound and the reducing compound may be put into a reaction solution multiple times at predetermined time intervals. By making the copper-containing compound and the amino alcohol react multiple times in this way, it is possible to generate the copper fine particles having a desired shape or particle size.

In forming the mixture, the copper-containing compound and the amino alcohol may be first mixed and kept mixed at 0 to 50° C. for about five to thirty minutes, followed by the addition of the reducing compound and mixing. This results in the efficient formation of the complex of the copper-containing compound and the amino alcohol in the mixture.

In this mixing, as for the amount of each of the compounds used relative to 1 mol of the copper-containing compound, that of the amino alcohol may be 0.5 to 10 mol and that of the reducing compound may be 0.5 to 5 mol. The amount of the organic solvent used only needs to be large enough to cause the sufficient reaction of the components, and may be, for example, about 50 to 2000 mL.

<Heating of the Mixture>

In the next step, by the sufficient heating of the mixture formed and obtained above, a pyrolysis reaction of the copper-containing compound is made to progress. By this heating, the copper-containing compound forming the complex is decomposed into the organic matter ions derived from the copper-containing compound and the copper ions. The copper ions resulting from the decomposition are reduced by the reducing compound, and the metallic copper precipitates and grows into the copper fine particles.

Then, the organic matter ions derived from the copper-containing compound, which are generated at the same time when the metallic copper precipitates at this time, tend to be coordinated on a specific crystal face of the precipitated metallic copper.

This enables to control the growth direction of the copper fine particles to be generated, and also enables to efficiently obtain the polyhedral or plate-shaped copper fine particles.

Further, the later-described amine compound has a function of controlling the grown of the copper fine particles by adhering to their surfaces, thereby preventing the particles from becoming coarse.

The heating temperature of the mixture is a temperature at which the copper-containing compound can be pyrolyzed and reduced and the polyhedral or plate-shaped copper fine particles can be generated. For example, the heating temperature only needs to be 70° C. to 150° C. or may be 80 to 120° C. Further, the heating temperature is preferably lower than the boiling points of the raw material components and the organic solvent. The heating temperature within the above range enables the efficient generation of the copper fine particles and also leads to a decrease in the volatilization of the amine compound.

The heating temperature of 70° C. or higher causes the progress of the quantitative pyrolysis of the copper-containing compound. Further, the heating temperature of 150° C. or lower leads to a decrease in the volatilization amount of the amine, resulting in the stable progress of the pyrolysis.

The precipitated copper fine particles are separated from the organic solvent and so on by centrifugation or the like. A solid of the precipitated copper fine particles may be dried under reduced pressure. The copper fine particles of this embodiment can be obtained by such an operation.

<Shape and Size of the Copper Fine Particles>

The copper fine particles of this embodiment are in the state in which the amino alcohol forms a coordination bond with the copper atoms which are generated when the complex formed from the copper-containing compound and the reducing agent are pyrolyzed in the amino alcohol, as described above. The copper fine particles coated with the amino alcohol and the organic matter ion species derived from the copper-containing compound are considered to be formed because these copper atoms aggregate.

Therefore, it is possible to obtain any shape and size of the copper fine particles by appropriately selecting the types of the copper-containing compound, the amino alcohol, and the reducing agent that are to be used and the reaction temperature.

When the other amine compound is further added in the mixture of the copper-containing compound, the amino alcohol, and the reducing agent, the amine compound adheres to the surfaces of the copper fine particles generated by the aforesaid pyrolysis to lessen the oxidation and control the growth direction of the metallic copper.

By thus controlling the growth direction of the metallic copper, it is possible to obtain the copper fine particles with a specific shape such as the polyhedral or plate shape.

In this embodiment, the plate shape refers to a particle that has a uniform thickness and whose long side in a direction perpendicular to the thickness direction is three times the thickness or more. The polyhedral shape refers to a particle whose shape is similar to the plate shape described above but whose long side in a direction perpendicular to the thickness direction is less than three times the thickness.

The copper fine particles obtained by the above-described copper fine particle production method can be fired at low temperature. A conductive paste using the copper fine particles does not require a reducing atmosphere during the firing. Therefore, the resistance of the copper fine particles of this embodiment can be low even if they are fired at low temperature. In addition, a fine sintered film can be obtained because the amount of outgassing, which can cause voids, is small.

According to the above-described copper fine particle production method, it is possible to efficiently produce the copper fine particles that can be fired at low temperature in the atmosphere with a simple operation.

It is possible to confirm the shape of the obtained copper fine particles by observing them with a scanning electron microscope (product name: JSM-7600F; SEM, manufactured by JEOL Ltd.). Further, the dimensions (thickness, minor axis, and major axis) of the copper fine particles in this specification are each calculated as an average value of those of 10 copper fine particles (n=10) randomly selected based on an observation image of the above SEM. The average value is an arithmetic mean value, which may be calculated using ten or more copper fine particles.

Regarding the above-described copper fine particles, the higher a ratio of copper oxide to the whole copper, the lower the activity of the surfaces of the copper fine particles and the more difficult they are to sinter. This ratio of the copper oxide can be expressed as the degree of oxidation found by the following formula (I). The lower the degree of oxidation, the better, and it may be less than 3%. The degree of oxidation of less than 3% results in a paste composition with good sinterability and low resistance.

$$\text{degree of oxidation (\%)} = ([CuO]+[Cu_2O])/([Cu]+[CuO]+[Cu_2O]) \times 100 \qquad (I)$$

In the formula, [Cu] represents the content (mass %) of copper (Cu) in the copper fine particles, [CuO] represents the content (mass %) of copper (II) oxide in the copper fine particles, and [$Cu_2O$] represents the content (mass %) of copper (I) oxide in the copper fine particles.

The degree of oxidation can be calculated from the component contents measured using X-ray diffraction (XRD). The contents of the components can be obtained through the quantification by the RIR (reference intensity ratio) method from an integral intensity ratio of the strongest line peaks of the aforesaid Cu, CuO, and $Cu_2O$ components obtained by XRD.

The paste composition of this embodiment is made with (A) the copper fine particles, which are obtained by the above production method, having a thickness or minor axis of 10 to 500 nm and coated with the amino alcohol with a carbon number of 3 to 10.

As (B) the organic solvent of this embodiment, a known organic solvent is usable. Examples of (B) the organic solvent include alcohol (hydroxy compound) that functions as a reducing agent. (B) the organic solvent above is increased in the reducing power by being increased in temperature by a heating process during paste curing (sintering). Consequently, the paste composition can have a dense sintered structure and thus is highly conductive and highly adherent to a substrate such as a lead frame.

This mechanism is considered to occur as follows.

Since a joint part is sandwiched between a semiconductor element and a substrate, the heating during the sintering brings part of the organic solvent into a reflux state. Accordingly, the organic solvent does not volatilize immediately but remains at the joint part for a while. At this time, the copper oxide partly present in the copper fine particles of the paste composition and metal oxide (for example, copper oxide) present on the surface of the substrate to be joined are reduced to metals (for example, coppers) by the organic solvent (for example, the alcohol that functions as the reducing agent). The sintering of the copper particles with the reduced metals (for example, coppers) then progresses. Consequently, the paste composition at the joint part forms a metallic bond that is highly conductive and highly adherent to the substrate.

Specifically, the boiling point of (B) the organic solvent only needs to be 100 to 300° C., and may be 150 to 290° C. If the boiling point is 100° C. or higher, stable adhesion strength can be obtained without reducing ability being lowered by the volatilization of a dispersion medium. Further, if the boiling point is 300° C. or lower, the solvent is prevented from remaining in the film without volatilizing, leading to good sinterability.

Specific examples of (B) the organic solvent include 1-propanol, 2-propanol, butanol, pentanol, hexanol, heptanol, octanol, ethylene glycol, diethylene glycol, 1,3-propanediol, 1,2-propanediol, butyl carbitol, butyl carbitol acetate, ethyl carbitol, ethyl carbitol acetate, diethylene glycol diethyl ether, and butyl cellosolve. These solvents each can be used alone or two kinds or more of these can be used in combination.

Further, in the paste composition of this embodiment, an organic solvent other than the above-mentioned ones may be added according to its use.

The compounding amount of (B) the organic solvent relative to 100 parts by mass of (A) the copper fine particles only needs to be 2 to 20 parts by mass and may be 5 to 15 parts by mass. The compounding amount within this range enables to produce the paste composition having good workability.

Further, in the paste composition of this embodiment, (C) carboxylic acid and (D) a thermosetting resin such as an epoxy compound, a phenolic compound, an acrylic compound, or a maleimide compound may be mixed according to its use. Further, in the paste composition of this embodiment, a curing agent, a curing accelerator, a dispersant, metal powder of Cu, Ag, Al, Ni, or the like, and metal oxide powder of silica, alumina, or the like may be mixed as required.

(C) the carboxylic acid may be any of aliphatic carboxylic acid, aromatic carboxylic acid, and an anhydride of any of these carboxylic acids. Adding the carboxylic acid improves the dispersibility and low-temperature sinterability of the copper fine particles, making it possible to obtain stable adhesion strength.

In the paste composition of this embodiment, the carboxylic acid is blended to not only remove an oxide film of a base material to be joined but also remove a coating layer of (A) the copper fine particles which is generated by a ligand (protective group) exchange reaction at the time of the heating for joining, and remove an oxide film and copper oxide which are contained therein. In addition, since the carboxylic acid decomposes or transpires during the heating for joining, it does not impede the progress of the subsequent sintering of the coppers. Because of this, in the paste composition of this embodiment, the sintering of the coppers is promoted at lower temperature than before the addition.

The decomposition temperature of (C) the carboxylic acid may be 100 to 300° C. or may be 150 to 290° C. The decomposition temperature of (C) the carboxylic acid within this range is effective for removing the oxide film of the base material to be joined. If the decomposition temperature of (C) the carboxylic acid is 100° C. or higher, sinterability becomes good owing to the reducing operation of the carboxylic acid, making it possible to obtain a fine sintered film. Further, if the decomposition temperature of (C) the carboxylic acid is 300° C. or lower, the dispersion medium does not remain in the joining member after the sintering.

Examples of the aliphatic carboxylic acid include malonic acid, methylmalonic acid, dimethylmalonic acid, ethylmalonic acid, arylmalonic acid, 2,2'-thiodiacetic acid, 3,3'-thiodipropionic acid, 2,2'-(ethylenedithio)diacetic acid, 3,3'-dithiodipropionic acid, 2-ethyl-2-hydroxybutyric acid, dithiodiglycolic acid, diglycolic acid, acetylenedicarboxylic acid, maleic acid, malic acid, 2-isopropylmalic acid, tartaric acid, itaconic acid, 1,3-acetonedicarboxylic acid, tricarballylic acid, muconic acid, β-hydromuconic acid, succinic acid, methylsuccinic acid, dimethylsuccinic acid, glutaric acid, α-ketoglutaric acid, 2-methylglutaric acid, 3-methylglutaric acid, 2,2-dimethylglutaric acid, 3,3-dimethylglutaric acid, 2,2-bis(hydroxymethyl)propionic acid, citric acid, adipic acid, 3-tert-butyladipic acid, pimelic acid, phenyloxalic acid, phenylacetic acid, nitrophenylacetic acid, phenoxyacetic acid, nitrophenoxyacetic acid, phenylthioacetic acid, hydroxyphenylacetic acid, dihydroxyphenylacetic acid, mandelic acid, hydroxymandelic acid, dihydroxymandelic acid, 1,2,3,4-butanetetracarboxylic acid, suberic acid, 4,4'-dithiodibutyric acid, cinnamic acid, nitrocinnamic acid, hydroxycinnamic acid, dihydroxycinnamic acid, coumaric acid, phenylpyruvic acid, hydroxyphenylpyruvic acid, caffeic acid, homophthalic acid, tolylacetic acid, phenoxypropionic acid, hydroxyphenylpropionic acid, benzyloxyacetic acid, phenyllactic acid, tropic acid, 3-(phenylsulfonyl)propionic acid, 3,3-tetramethyleneglutaric acid, 5-oxoazelaic acid, azelaic acid, phenylsuccinic acid, 1,2-phenylenediacetic acid, 1,3-phenylenediacetic acid, 1,4-phenylenediacetic acid, benzylmalonic acid, sebacic acid, dodecanedioic acid, undecanedioic acid, diphenylacetic acid, benzilic acid, dicyclohexylacetic acid, tetradecanedioic acid, 2,2-diphenylpropionic acid, 3,3-diphenylpropionic acid, 4,4-bis(4-hydroxyphenyl)valeric acid, pimaric acid, palustric acid, isopimaric acid, abietic acid, dehydroabietic acid, neoabietic acid, and agathic acid.

Examples of the aromatic carboxylic acid include benzoic acid, 2-hydroxybenzoic acid, 3-hydroxybenzoic acid, 4-hydroxybenzoic acid, 2,3-dihydroxybenzoic acid, 2,4-dihydroxybenzoic acid, 2, 5-dihydroxybenzoic acid, 2,6-dihydroxybenzoic acid, 3,4-dihydroxybenzoic acid, 2,3,4-trihydroxybenzoic acid, 2,4,6-trihydroxybenzoic acid, 3,4,5-trihydroxybenzoic acid, 1,2,3-benzenetricarboxylic acid, 1,2,4-benzenetricarboxylic acid, 1,3,5-benzenetricarboxylic acid, 2-[bis(4-hydroxyphenyl)methyl]benzoic acid, 1-naphthoic acid, 2-naphthoic acid, 1-hydroxy-2-naphthoic acid, 2-hydroxy-1-naphthoic acid, 3-hydroxy-2-naphthoic acid, 6-hydroxy-2-naphthoic acid, 1,4-dihydroxy-2-naphthoic acid, 3,5-dihydroxy-2-naphthoic acid, 3,7-dihydroxy-2-naphthoic acid, 2,3-naphthalenedicarboxylic acid, 2,6-naphthalenedicarboxylic acid, 2-phenoxybenzoic acid, biphenyl-4-carboxylic acid, biphenyl-2-carboxylic acid, and 2-benzoylbenzoic acid.

Among these, from the viewpoint of storage stability and easy availability, usable are succinic acid, malic acid, itaconic acid, 2,2-bis(hydroxymethyl)propionic acid, adipic acid, 3,3'-thiodipropionic acid, 3,3'-dithiodipropionic acid, 1,2,3,4-butanetetracarboxylic acid, suberic acid, sebacic acid, phenylsuccinic acid, dodecanedioic acid, diphenylacetic acid, benzilic acid, 4,4-bis(4-hydroxyphenyl)valeric acid, abietic acid, 2,5-dihydroxybenzoic acid, 3,4,5-trihydroxybenzoic acid, 1,2,4-benzenetricarboxylic acid, 1,3,5-benzenetricarboxylic acid, 2-[bis(4-hydroxyphenyl)methyl] benzoic acid, acetic anhydride, propionic anhydride, butyric anhydride, isobutyric anhydride, valeric anhydride, trimethylacetic anhydride, hexanoic anhydride, heptanoic anhydride, decanoic anhydride, lauric anhydride, myristic anhydride, palmitic anhydride, stearic anhydride, docosanoic anhydride, crotonic anhydride, methacrylic anhydride, oleic anhydride, linoleic anhydride, chloroacetic anhydride, iodoacetic anhydride, dichloroacetic anhydride, trifluoroacetic anhydride, chlorodifluoroacetic anhydride, trichloroacetic anhydride, pentafluoropropionic anhydride, heptafluorobutyric anhydride, succinic anhydride, methylsuccinic anhydride, 2,2-dimethylsuccinic anhydride, itaconic anhydride, maleic anhydride, glutaric anhydride, diglycolic anhydride, benzoic anhydride, phenylsuccinic anhydride, phenylmaleic anhydride, homophthalic anhydride, isatoic anhydride, phthalic anhydride, tetrafluorophthalic anhydride, and tetrabromophthalic anhydride. These compounds each may be used alone or two or more of them may be used in combination.

(C) the carboxylic acid may also be carboxylic anhydride. In particular, having a high coordination ability on the surfaces of the copper fine particles, the carboxylic anhydride substitutes for the protective groups on the surfaces of the copper fine particles, so that the carboxylic anhydride is coordinated on the surfaces of the copper fine particles. The copper fine particles on whose surfaces the carboxylic anhydride is coordinated exhibit good dispersibility, and also exhibit good low-temperature sinterability owing to the excellent volatility of the carboxylic anhydride.

The content of (C) the carboxylic acid relative to 100 parts by mass of the component (A) is 0 to 5 parts by mass and may be 0.01 to 5 parts by mass. The paste composition in which this content is 5 parts by mass or less can have good reliability without any void.

As (D) the thermosetting resin, any thermosetting resin ordinarily used as an adhesive is usable without limitation. The thermosetting resin may be a liquid resin, and a resin that is in a liquid state at room temperature (25° C.) is usable. Examples of (D) the thermosetting resin include an epoxy resin, a phenolic resin, a radical polymerizable acrylic resin, and a maleimide resin. The paste composition of this embodiment becomes an adhesive material with moderate viscosity by containing (D) the thermosetting resin. In addition, since the paste composition of this embodiment contains (D) the thermosetting resin, the reaction heat at the time of its curing raises the temperature of the resin composition to promote the sinterability of the copper fine particles.

Here, the compounding amount of (D) the thermosetting resin relative to 100 parts by mass of (A) the copper fine particles is 0 to 10 parts by mass and may be 1 to 10 parts by mass.

If the compounding amount of the component (D) is 10 parts by mass or less, the obtained paste composition exhibits good thermal conductivity and has an excellent heat dissipating property.

In addition, the obtained paste composition is not degraded much by the influences of light and heat, and thus can be used as a joining material for long-life light-emitting devices.

As described above, the paste composition of this embodiment contains: (A) the copper fine particles having a thickness or minor axis of 10 to 500 nm and coated with the amino alcohol represented by the chemical formula (1); and (B) the organic solvent.

Further, in the method of producing the paste composition of this embodiment, after (C) the carboxylic acid, (D) the thermosetting resin, and the other components which are added as required are mixed, a kneading process with a disperser, a kneader, a 3-roll mill, a planetary mixer, or the like is further performed.

Next, the obtained resin composition is defoamed, whereby the paste composition is obtained.

Note that, in this specification, the paste composition includes those with a low viscosity such as slurry and ink. The viscosity of the paste composition of this embodiment is, for example, 40 to 300 Pa·s and may be 60 to 200 Pa·s.

[Semiconductor Device and Electrical/Electronic Component]

In a semiconductor device of this embodiment, a semiconductor element is bonded on a substrate that serves as an element support member, using the above-described paste composition. That is, the paste composition is used here as a die attach paste.

The semiconductor element used here may be any known semiconductor element, for example, a transistor, a diode, or the like. Further, this semiconductor element includes a light-emitting element such as a LED. Further, the type of the light-emitting element is not particularly limited. Examples thereof include those in which a nitride semiconductor such as InN, AlN, GaN, InGaN, AlGaN, or InGaAlN is formed as a light-emitting layer on a substrate by the MOCVD method or the like.

Further, the element support member can be a support member formed of a material such as copper, silver-plated copper, PPF (preplated lead frame), glass epoxy, or ceramic.

The semiconductor device using the paste composition of this embodiment has advantages that its electrical resistance value is sufficiently small, and it undergoes only a little change over time and thus has a long life with little decrease in output over time even after a long drive time.

Further, in an electrical/electronic component of this embodiment, a heat generating member and a heat dissipating member are bonded through the above-described paste composition. That is, the paste composition is used here as a heat dissipating member bonding material.

Here, the heat generating member may be the aforesaid semiconductor element, a member having the semiconductor element, or any other heat generating member. Examples of the heat generating member other than the semiconductor element include an optical pickup and a power transistor. Further, examples of the heat dissipating member include a heat sink and a heat spreader.

In the electrical/electronic component in which the heat dissipating member is thus bonded to the heat generating member using the above-described paste composition, the heat dissipating member is capable of efficiently releasing the heat generated by the heat generating member to the outside to reduce a temperature increase of the heat generating member. Note that the heat generating member and the heat dissipating member may be directly bonded with the paste composition, or may be indirectly bonded with another member high in thermal conductivity therebetween.

[Substrate Having a Conductive Pattern]

A substrate used as this substrate having the conductive pattern is not particularly limited. For example, an organic substrate, a ceramic substrate, a glass substrate, or the like is usable. In particular, from the viewpoint of flexibility, the substrate used may be a film made of polyimide, polyethylene terephthalate (PET), or polyethylene naphthalate (PEN).

Here, the paste composition containing the copper fine particles is used as a material for forming conductive wiring.

The above-described paste composition can be low in resistance at 150° C. Therefore, it is possible to form the conductive pattern by directly drawing the conductive pattern with a desired shape by applying the above-described paste composition on the substrate where to form the wiring, and by heating the paste composition to fuse the copper fine particles in the paste composition drawn on the substrate.

Using the paste composition of this embodiment makes it possible to replace an electronic circuit and electronic element production process which employs a subtractive process by photolithography, a vacuum process such as sputtering, or a wet process such as etching or plating, with a printing method under atmospheric pressure. This can make an electronic circuit manufacturing method resource-saving and highly productive.

EXAMPLES

Next, the present disclosure will be described in more detail using Examples and Comparative Example.

Production of the Copper Fine Particles

Reference Example 1

Copper citrate (5 mmol), citric acid (3.75 mmol), and butyl cellosolve (3 ml) were put in a 50 mL sample bottle and mixed at 90° C. for five minutes in an aluminum block type thermostirrer. To this, 1-amino-2-propanol (60 mmol) was added, followed by heating for another five minutes, whereby a copper precursor solution was prepared. This solution was cooled to room temperature, and then hydrazinoethanol (20 mmol) dissolved in 3 mL 1-propanol was added to the copper precursor solution in the sample bottle, followed by five-minute stirring.

This was heated and stirred again for two hours in the aluminum block type thermostirrer at 90° C. Five minutes later, 2 mL ethanol (Kanto Chemical, special grade) was added, and a solid was obtained by centrifugation (4000 rpm (1 minute)). When the centrifuged solid was dried under reduced pressure, powdery copper fine particles 1 (0.66 g yield, 97.2% yield ratio) with a copper gloss were obtained. The copper fine particles 1 had surfaces coated with the 1-amino-2-propanol.

Reference Example 2

A solid was obtained by the same operation using the same base materials as those in Reference Example 1 except that the 1-amino-2-propanol in Reference Example 1 was replaced with 4-amino-1-butanol (30 mmol) and octylamine (30 mmol) was further added. When the centrifuged solid was dried under reduced pressure, powdery copper fine particles 2 (0.62 g yield, 94.5% yield ratio) having a copper luster were obtained. The copper fine particles 2 had surfaces coated with the 4-amino-1-butanol.

Reference Example 3

Cuprous oxide (8.75 mmol) and 1-propanol (5 mL) were put in a 50 mL sample bottle and mixed at 90° C. for five minutes in an aluminum block type thermostirrer. To this, 4-amino-1-butanol (30 mmol) and octylamine (30 mmol) were added, followed by heating for another five minutes, whereby a copper precursor solution was prepared. This solution was cooled to room temperature, and then hydrazine monohydrate (20 mmol) dissolved in 3 mL 1-propanol was added to the copper precursor solution in the sample bottle, followed by five-minute stirring.

This was heated and stirred again for two hours in the aluminum block type thermostirrer at 90° C. Five minutes later, 2 mL ethanol (Kanto Chemical, special grade) was added, and a solid was obtained by centrifugation (4000 rpm (one minute)). When the centrifuged solid was dried under reduced pressure, powdery copper fine particles 3 (1.0 g yield, 98.5% yield ratio) with a copper gloss were obtained. The copper fine particles 3 had surfaces coated with the 4-amino-1-butanol.

Reference Example 4

Copper oxalate (3.33 mmol) was put in a mixture solution of hydrazine monohydrate (13.2 mmol) and 5 mL methanol being a reaction medium, which were mixed in advance at room temperature, and then the mixture was stirred for ten minutes, whereby a copper oxalate-hydrazine complex (composite compound) was generated.

To the obtained copper oxalate-hydrazine complex, oleylamine (16.6 mmol) was added, followed by ten-minute stirring at room temperature, whereby a suspension was prepared. After the stirring, a container containing the mixture solution was heated in a 150° C. oil bath. As a result of the heating, the mixture solution foamed and reddened, and then it was heated and stirred for one hour, whereby a suspension with a copper luster was obtained. After it was cooled to room temperature, ethanol (Kanto Chemical, special grade) (2 mL) was added, and a solid was obtained by centrifugation (4000 rpm (one minute)). When the centrifuged solid was dried under reduced pressure, powdery copper fine particles 4 (0.62 g yield, 61.5% yield ratio) with a copper luster were obtained. The copper fine particles 4 had surfaces coated with the oleylamine.

Figure 2:
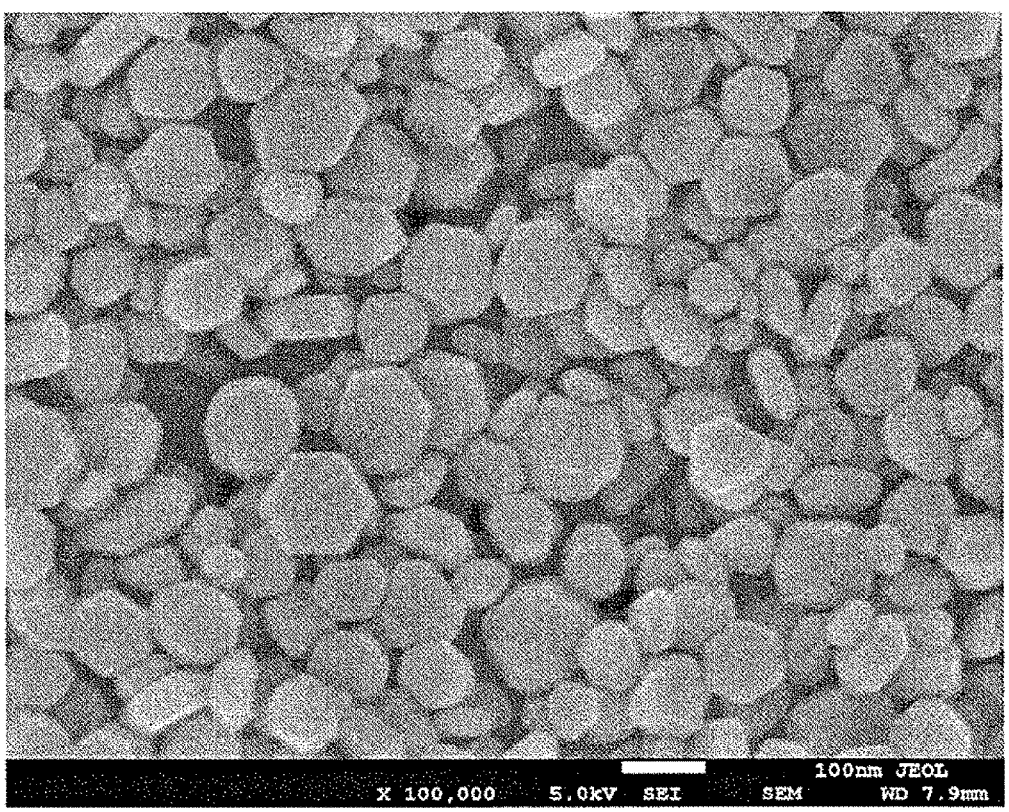
FIG. 2 is an electron micrograph of copper fine particles obtained in Reference Example 2.
Figure 3:
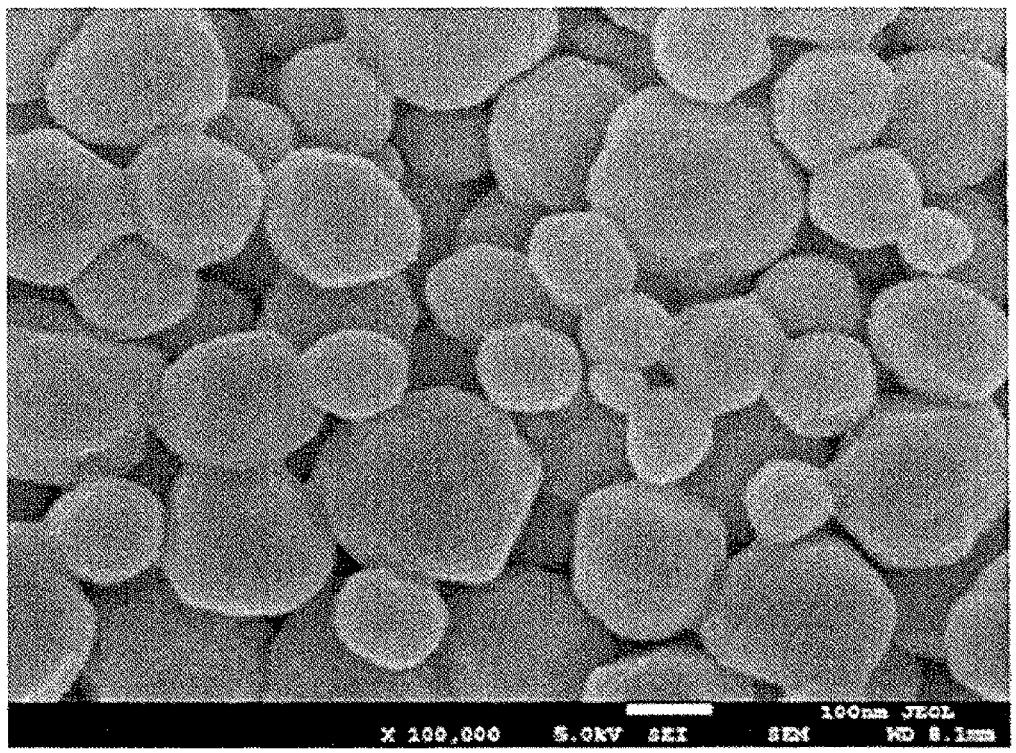
FIG. 3 is an electron micrograph of copper fine particles obtained in Reference Example 3.
Figure 4:
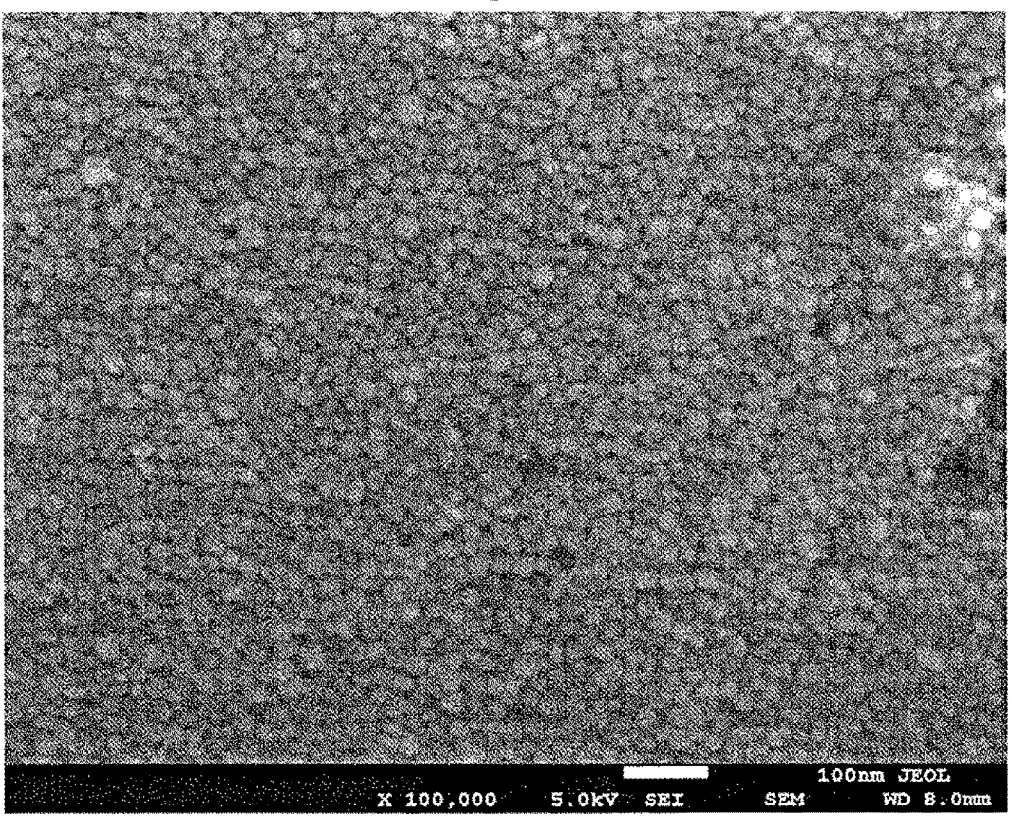
FIG. 4 is an electron micrograph of copper fine particles obtained in Reference Example 4.

The obtained copper fine particles of Reference Examples 1 to 4 were observed with a scanning electron microscope (product name: JSM-7600F; SEM, manufactured by JEOL Ltd.), and particle size and particle shape were observed to be evaluated. FIGS. 1 to 4 are electron micrographs of these copper fine particles. Further, regarding the above copper fine particles, the degree of oxidation, the amount of outgassing, and the yield ratio were also examined as follows. These properties are summarized in Table 1.

TABLE 1

|  | Reference Example 1 (copper fine particles 1) | Reference Example 2 (copper fine particles 2) | Reference Example 3 (copper fine particles 3) | Reference Example 4 (copper fine particles 4) |
| --- | --- | --- | --- | --- |
| Degree of oxidation (%) | 1.5 | 1.0 | 0.0 | 5.6 |
| Particle size (nm) | Minor axis: 221 Thickness: 50 | Thickness: 20 Minor axis: 100 | Minor axis: 123 | 20 |
| Particle shape | Mixture of polyhedral and plate shapes | Plate shaped | Polyhedral | Spherical |
| Coating amine | 1-amino-2-propanol | Aminobutanol, octylamine | Aminobutanol, octylamine | Oleylamine |
| Amount of outgassing (%) | 0.7 | 2.8 | 0.5 | 11.6 |
| Yield ratio | 97.2 | 94.5 | 98.5 | 61.5 |

<Method of Evaluating the Copper Fine Particles>

[Degree of Oxidation]

Based on X-ray diffraction (XRD), the contents of Cu, CuO, and $Cu_2O$ components were determined from an integral intensity ratio of their strongest line peaks by the RIR (reference intensity ratio) method, and the degree of oxidation of the copper fine particles was calculated by the following formula (I).

$$\text{degree of oxidation (\%)} = ([CuO]+[Cu_2O])/([Cu]+[CuO]+[Cu_2O]) \times 100 \qquad (I)$$

In the formula, [Cu] represents the content (mass %) of copper (Cu) in the copper fine particles, [CuO] represents the content (mass %) of copper (II) oxide in the copper fine particles, and $[Cu_2O]$ represents the content (mass %) of copper (I) oxide in the copper fine particles.

[Particle Size]

As the particle size of the copper fine particles, an average value of those of 10 copper fine particles (n=10) randomly selected based on an image of the obtained solid product observed with a scanning electron microscope (product name: JSM-7600F: SEM, manufactured by JOEL Ltd.) was calculated. At this time, the major axis, the minor axis, and the thickness can also be calculated by the same method.

[Particle Shape]

The particle shape of the copper fine particles was observed with a scanning electron microscope (JSM-7600F; SEM, manufactured by JEOL Ltd.).

[Amount of Outgassing]

The amount of outgassing of the copper fine particles was measured using dry powder of the obtained copper fine particles by simultaneous differential thermal and thermogravimetric analysis (TG-DTA) while they were heated from 40 to 500° C. at a temperature increase rate of 10° C./min., and an amount of mass by which the mass after the measurement decreased from that before the measurement was calculated as the amount of outgassing (%).

(A2): The copper fine particles 2 obtained in Reference Example 2

(A3): The copper fine particles 3 obtained in Reference Example 3

[Other Copper Fine Particles]

(CA1): The copper fine particles 4 obtained in Reference Example 4

[(B) Organic solvent]

(B1): Diethylene glycol (manufactured by Tokyo Chemical Industry Co., Ltd.)

[(C) Carboxylic acid]

(C1): Glutaric anhydride (manufactured by Wako Pure Chemical Corporation)

[(D) Thermosetting resin]

(D1): Bisphenol A-type epoxy resin (product name: jER828 manufactured by Mitsubishi Chemical Corporation)

Curing accelerator: imidazole (product name: 2E4MZ manufactured by Shikoku Chemicals Corporation)

TABLE 2

| | | | Example 1 | Example 2 | Example 3 | Example 4 | Comparative Example 1 |
|---|---|---|---|---|---|---|---|
| Composition (part by mass) | (A) Copper fine particles | (A1) Copper fine particles 1 | 100 | 100 | — | — | — |
| | | (A2) Copper fine particles 2 | — | — | 100 | — | — |
| | | (A3) Copper fine particles 3 | — | — | — | 100 | — |
| | Other copper fine particles | (CA1) Copper fine particles 4 | — | — | — | — | 100 |
| | (B) Organic solvent | Diethylene glycol | 10 | 10 | 10 | 10 | 10 |
| | (C) Carboxylic acid | Glutaric anhydride | 0.3 | — | 0.3 | 0.3 | 0.3 |
| | (D) Thermosetting resin | Bisphenol A-type epoxy resin | 10 | 10 | 10 | 10 | 10 |
| | Curing accelerator | Imidazole | 1 | 1 | 1 | 1 | 1 |
| Properties | Viscosity [Pa · s] | | 32 | 34 | 32 | 33 | 38 |
| | Pot life [days] | | >7 | >7 | >7 | >7 | >7 |
| | Thermal conductivity [W/m · K] | | 120 | 106 | 125 | 128 | 80 |
| | Electrical resistance [Ω] | 175° C. | $9 \times 10^{-6}$ | $9 \times 10^{-6}$ | $9 \times 10^{-6}$ | $8 \times 10^{-6}$ | Unable to measure |
| | | 200° C. | $8 \times 10^{-6}$ | $8 \times 10^{-6}$ | $8 \times 10^{-6}$ | $7 \times 10^{-6}$ | $5 \times 10^{-6}$ |
| | | 225° C. | $6 \times 10^{-6}$ | $6 \times 10^{-6}$ | $6 \times 10^{-6}$ | $4 \times 10^{-6}$ | $4 \times 10^{-6}$ |
| | Thermal-time adhesion strength [N/chip] to copper frame | Normal state | 35 | 31 | 32 | 36 | 5 |
| | | After moisture absorption process | 35 | 31 | 32 | 35 | 5 |
| | Thermal-time adhesion strength [N/chip] to PPF | Normal state | 30 | 28 | 29 | 33 | 4 |
| | | After moisture absorption process | 30 | 27 | 29 | 32 | 4 |
| | Thermal-time adhesion strength after high-temperature process [N/chip] to PPF | After 100-hour heating process | 30 | 28 | 29 | 32 | 4 |
| | | After 1000-hour heating process | 30 | 28 | 28 | 32 | 2 |
| | | After 100 thermal cycles | 30 | 28 | 28 | 32 | 4 |
| | | After 1000 thermal cycles | 30 | 27 | 28 | 32 | 2 |
| | Thermal shock resistance [NG number/5] on copper frame | After IR reflow | 0/5 | 0/5 | 0/5 | 0/5 | 5/5 |
| | | After 1000 thermal cycles | 0/5 | 0/5 | 0/5 | 0/5 | 5/5 |
| | Thermal shock resistance [NG number/5] on PPF | After IR reflow | 0/5 | 0/5 | 0/5 | 0/5 | 5/5 |
| | | After 1000 thermal cycles | 0/5 | 0/5 | 0/5 | 0/5 | 5/5 |
| | Void ratio | | Good | Good | Good | Good | Unacceptable |

Examples 1 to 4, Comparative Example 1

To produce paste compositions, the components were mixed according to the formulas (part by mass) in Table 2 and the mixtures were kneaded with a roll. The obtained paste compositions were evaluated by the following methods. Table 2 also shows the results of the evaluation. As the materials used in Examples 1 to 4 and Comparative Example 1, commercially available products were used, except for the copper fine particles.

[(A) Copper Fine Particles]

(A1): The copper fine particles 1 obtained in Reference Example 1

<Method of Evaluating the Paste Compositions>

[Viscosity]

The viscosity of each of the paste compositions was measured at 25° C. at 5 rpm using an E-type viscometer (3° cone).

[Pot Life]

The number of days it took for the viscosity after the resin paste was left in a 25° C. thermostatic bath to increase to 1.5 times or more of the initial viscosity was measured.

[Thermal Conductivity]

The thermal conductivity of each of the paste compositions cured at 175° C. for thirty minutes was measured by a laser flash method according to JIS R 1611-1997.

[Electrical Resistance]

Test pieces were each fabricated by applying the paste composition on a glass substrate (1 mm thickness) up to a 200 μm by a screen-printing method, followed by curing at 175° C., 200° C., and 225° C. for sixty minutes. The electrical resistance of each of the cured paste compositions was measured by a four-terminal method using a high-precision high-performance resistivity meter "MCP-T600" (product name, manufactured by Mitsubishi Chemical Corporation).

<Method of Evaluating Semiconductor Devices>

[Thermal-Time Adhesion Strength]

Test pieces were each fabricated by mounting a gold-backside chip whose 4 mm×4 mm faying surface was provided with a gold deposition layer, on a pure copper frame and PPF (copper frame plated with Ni—Pd/Au) using the paste composition, followed by curing at 200° C. for sixty minutes. The test pieces each having the chip mounted on the frame were subjected to a moisture absorption process under the condition of 85° C., 85% relative humidity, and 72 hours.

The thermal-time adhesion strength of each of the paste compositions was determined by measuring thermal-time die shear strength at 260° C. between the chip and the frame using a mount strength measuring device.

[Thermal-Time Adhesion Strength after a High-Temperature Heating Process]

Test pieces were each fabricated by mounting a gold-backside chip whose 4 mm×4 mm faying surface was provided with a gold deposition layer, on PPF (copper frame plated with Ni—Pd/Au) using the paste composition for semiconductors and joining them by curing at 200° C. for sixty minutes.

As the thermal-time adhesion strength of each of the paste compositions after a high-temperature heating process, thermal-time die shear strength at 260° C. was measured using a mount strength measuring device after the heating process was performed at 250° C. for 100 hours and 1000 hours.

As the thermal-time adhesion strength of each of the paste compositions after a high-temperature heating process by a thermal cycle process, thermal-time die shear strength at 260° C. was measured using a mount strength measuring device after the paste composition was subjected to 100-cycle and 1000-cycle processes, with one cycle consisting of the operation of heating from −40° C. to 250° C. and cooling to −40° C.

[Thermal Shock Resistance]

Test pieces were each fabricated by mounting a gold-backside silicon chip whose 6 mm×6 mm faying surface was provided with a gold deposition layer, on a copper frame and PPF using the paste composition. The curing condition of the paste in joining the above silicon chip to the copper frame and the PPF was such that the paste was cured on a hotplate by 200° C., sixty-second heating (HP curing) or was cured by 200° C., sixty-minute heating using an oven (OV curing). The silicon chips mounted on the above frames were each resin-sealed with an epoxy encapsulant (product name: KE-G3000D) manufactured by KYOCERA Corporation under the following conditions, whereby packages were obtained. In a thermal shock resistance test, the above resin-sealed packages were subjected to a moisture absorption process under the condition of 85° C., 85% relative humidity, and 168 hours, followed by an IR reflow process (260° C., ten seconds), and a thermal cycle process (1000 cycles, with one cycle consisting of the operation of raising the temperature from −55° C. to 150° C. and cooling to −55° C.) was performed. For the evaluation, the number of cracks occurring inside each of the packages after each of the processes was observed using an ultrasonic microscope. In the evaluation result of the thermal shock resistance, the number of samples where cracks occurred among five samples was indicated.

Test pieces and curing conditions of the epoxy encapsulant

Package type: 80 pQFP (14 mm×20 mm×2 mm thickness)

Chip overview: silicon chip and gold-plated-backside chip

Lead frame: PPF and copper

Molding with the epoxy encapsulant: 175°, two minutes

Post-mold curing: 175° C., eight hours

[Void Ratio]

The void ratio of each of the paste compositions was found by the observation using a microfocus X-ray inspection device (SMX-1000, manufactured by Shimadzu Corporation). The evaluation criteria of the void ratio were as follows: the incidence rate of less than 5% was determined as good, 5% or more and less than 8% was determined as acceptable, and 8% or more was determined as unacceptable. The above void ratio was calculated by the following formula by observing a solder-joint part from a direction perpendicular to a faying surface with an X-ray transmission device and finding the area of voids and the area of the joint part.

void ratio (%)=area of voids÷(area of voids+area of joint part)×100

The above results led to the findings that the paste composition containing the copper fine particles of the present disclosure is excellent in sinterability at low temperature of about 175° C.

It has also been found out that the paste composition has good thermal conductivity since it can be in a good sintered state owing to the contained carboxylic anhydride.

In addition, the copper fine particles obtained in Examples have a particle thickness or minor axis of about 10 to 500 nm, can be sintered at low temperature, and have a small amount of outgassing. Therefore, the copper fine particles obtained in Examples can also be used as an element bonding die attach paste, a heat dissipating member bonding material, and a conductive wiring material of wiring boards. The use of this conductive paste allows the low-temperature sintering and makes it possible to obtain highly reliable semiconductor devices, electrical/electronic devices, and substrates with conductive patterns.

What is claimed is:

1. A paste composition containing:
   (A) copper fine particles having a thickness or minor axis of 20 to 500 nm and coated with amino alcohol represented by the following chemical formula (1);
   (B) an organic solvent; and
   (C) a thermosetting resin;
   wherein a compounding amount of (B) the organic solvent is 2 to 20 parts by mass relative to 100 parts by mass of (A), the copper fine particles; and
   wherein the compounding amount of (C), the thermosetting resin, is 1 to 10 part by mass to 100 parts by mass of (A), the copper fine particles;
   wherein the copper fine particles are polyhedral copper fine particles;

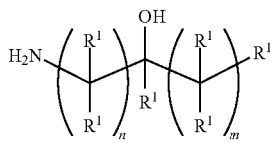

(1)

where R¹s each independently represent a hydrogen atom, n and m each represent an integer of 0 to 10 and m+n is 10 or less.

2. The paste composition according to claim 1, wherein a degree of oxidation of (A) the copper fine particles as calculated by the following formula (I) is less than 3%, degree of oxidation (%)=([CuO]+[Cu$_2$O])/([Cu]+[CuO]+[Cu$_2$O])×100    (I)

where [Cu] represents the content (mass %) of copper (Cu) in the copper fine particles, [CuO] represents the content of copper (II) oxide in the copper fine particles, and [Cu$_2$O] represents the content (mass %) of copper (I) oxide in the copper fine particles.

3. The paste composition according to claim 1, wherein (B) the organic solvent is an alcohol functioning as a reducing agent.

4. The paste composition according to claim 1, further containing (D) carboxylic acid.

5. A paste composition containing:
(A) copper fine particles having a thickness or minor axis of 20 to 500 nm and coated with amino alcohol represented by the following chemical formula (1);
(B) an organic solvent; and
(C) a thermosetting resin;
wherein a compounding amount of (B) the organic solvent is 2 to 20 parts by mass relative to 100 parts by mass of (A), the copper fine particles; and
wherein the compounding amount of (C), the thermosetting resin, is 1 to 10 part by mass to 100 parts by mass of (A), the copper fine particles;
wherein the copper fine particles are plate-shaped copper fine particles;

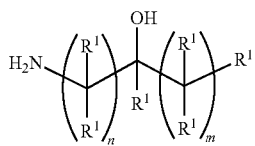

(1)

where R¹s each independently represent a hydrogen atom, n and m each represent an integer of 0 to 10 and m+n is 10 or less.

6. The paste composition according to claim 5, wherein a degree of oxidation of (A) the copper fine particles as calculated by the following formula (I) is less than 3%, degree of oxidation (%)=([CuO]+[Cu$_2$O])/([Cu]+[CuO]+[Cu$_2$O])×100    (I)

where [Cu] represents the content (mass %) of copper (Cu) in the copper fine particles, [CuO] represents the content of copper (II) oxide in the copper fine particles, and [Cu$_2$O] represents the content (mass %) of copper (I) oxide in the copper fine particles.

7. The paste composition according to claim 5, wherein (B) the organic solvent is an alcohol functioning as a reducing agent.

8. The paste composition according to claim 5, further containing (D) carboxylic acid.

9. A semiconductor device comprising:
a substrate; and
a semiconductor element bonded on the substrate through a cured matter of a die attach material which contains the paste composition according to claim 1.

10. The semiconductor device according to claim 9, wherein the semiconductor element is a light-emitting element.

11. A semiconductor device comprising:
a substrate; and
a semiconductor element bonded on the substrate through a cured matter of a die attach material which contains the paste composition according to claim 5.

12. The semiconductor device according to claim 11, wherein the semiconductor element is a light-emitting element.

13. An electrical/electronic device comprising:
a heat generating component; and
a heat dissipating member bonded on the heat generating component through a cured matter of a heat dissipating member bonding material which contains the paste composition according to claim 1.

14. An electrical/electronic device comprising:
a heat generating component; and
a heat dissipating member bonded on the heat generating component through a cured matter of a heat dissipating member bonding material which contains the paste composition according to claim 5.

* * * * *